US012060634B2

(12) United States Patent
Bangert et al.

(10) Patent No.: US 12,060,634 B2
(45) Date of Patent: Aug. 13, 2024

(54) ROLLER FOR TRANSPORTING A FLEXIBLE SUBSTRATE, VACUUM PROCESSING APPARATUS, AND METHOD OF COOLING A ROLLER

(71) Applicant: Applied Materials, Inc., Santa Clara, CA (US)

(72) Inventors: Stefan Bangert, Steinau (DE); Thomas Deppisch, Aschaffenburg (DE); Wolfgang Buschbeck, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 55 days.

(21) Appl. No.: 17/317,115

(22) Filed: May 11, 2021

(65) Prior Publication Data

US 2022/0364223 A1 Nov. 17, 2022

(51) Int. Cl.
| | | |
|---|---|---|
| C23C 14/54 | (2006.01) | |
| C23C 14/50 | (2006.01) | |
| C23C 14/56 | (2006.01) | |
| C23C 16/458 | (2006.01) | |
| C23C 16/46 | (2006.01) | |

(52) U.S. Cl.
CPC .......... *C23C 14/541* (2013.01); *C23C 14/505* (2013.01); *C23C 14/562* (2013.01); *C23C 16/4584* (2013.01); *C23C 16/463* (2013.01)

(58) Field of Classification Search
None
See application file for complete search history.

(56) References Cited

U.S. PATENT DOCUMENTS

| | | | |
|---|---|---|---|
| 5,679,166 A | 10/1997 | Thoma et al. | |
| 2006/0214319 A1* | 9/2006 | Kazama | B29C 48/914 264/40.6 |
| 2007/0264448 A1* | 11/2007 | Fujita | B29C 48/08 428/1.31 |
| 2010/0239837 A1* | 9/2010 | Hagiwara | B29C 48/08 264/1.6 |
| 2011/0114282 A1* | 5/2011 | Hovestadt | F28F 5/02 164/448 |

FOREIGN PATENT DOCUMENTS

| | | |
|---|---|---|
| CN | 1840321 A | 10/2006 |
| CN | 101391266 A | 3/2009 |
| CN | 109415804 A | 3/2019 |
| CN | 111250671 A | 6/2020 |
| CN | 111515253 A | 8/2020 |
| JP | 07-241982 A | 9/1995 |

(Continued)

OTHER PUBLICATIONS

International Search Report and Written Opinion, PCT/US2022/025197, Aug. 4, 2022.

(Continued)

*Primary Examiner* — Alexander M Weddle

(57) ABSTRACT

A roller for transporting a flexible substrate is described. The roller includes a first coolant supply for cooling a first part of the roller and a second coolant supply for cooling a second part and a third part of the roller. The first part is provided between the second part and the third part. Additionally, a vacuum processing apparatus including a roller and a method of cooling a roller are described.

16 Claims, 2 Drawing Sheets

(56) References Cited

FOREIGN PATENT DOCUMENTS

| JP | 2011034008 A | * | 2/2011 | ............... F28D 7/12 |
| WO | WO-9319874 A1 | * | 10/1993 | ............. B21B 27/08 |
| WO | 2018-228683 A1 | | 12/2018 | |
| WO | WO-2019217700 A1 | * | 11/2019 | ......... B22D 11/0622 |

OTHER PUBLICATIONS

Office Action for Taiwan Application No. 111115180 dated Sep. 11, 2023.
Search Report for Taiwan Application No. 111115180 dated Sep. 8, 2023.
Office Action for Taiwan Application No. 111115180 dated Feb. 13, 2023.
Search Report for Taiwan Application No. 111115180 dated Feb. 10, 2023.

* cited by examiner

ROLLER FOR TRANSPORTING A FLEXIBLE SUBSTRATE, VACUUM PROCESSING APPARATUS, AND METHOD OF COOLING A ROLLER

TECHNICAL FIELD

Embodiments of the present disclosure relate to rollers for transporting a flexible substrate. Further, embodiments of the disclosure relate to apparatuses and methods for flexible substrate processing, particularly coating of flexible substrates with thin layers, using a roll-to-roll process. In particular, embodiments of the disclosure relate to rollers employed for transportation of flexible substrates in apparatuses and methods for coating the flexible substrate with a stack of layers, e.g. for thin-film solar cell production, thin-film battery production, or flexible display production.

BACKGROUND

Processing of flexible substrates, such as plastic films or foils, is in high demand in the packaging industry, semiconductor industries and other industries. Processing may consist of coating a flexible substrate with a material, such as a metal, a semiconductor and a dielectric material, etching and other processing actions conducted on a substrate for the respective applications. Systems performing this task typically include a coating drum, e.g. a cylindrical roller, coupled to a processing system with a roller assembly for transporting the substrate, and on which at least a portion of the substrate is coated.

For example, a coating process such as a CVD process, a PVD process or an evaporation process can be utilized for depositing thin layers onto flexible substrates. Roll-to-roll deposition apparatuses are understood in that a flexible substrate of a considerable length, such as one kilometer or more, is uncoiled from a supply spool, coated with a stack of thin layers, and recoiled again on a wind-up spool. In particular, in the manufacture of thin film batteries, e.g. lithium batteries, the display industry and the photovoltaic (PV) industry, roll-to-roll deposition systems are of high interest. For example, the increasing demand for flexible touch panel elements, flexible displays, and flexible PV modules results in an increasing demand for depositing suitable layers in roll-to-roll coaters.

For achieving high quality coatings on flexible substrates, various challenges with respect to flexible substrate transportation have to be mastered. For example, providing an appropriate substrate tension as well as a good substrate-roller contact and substrate cooling during the processing of the moving flexible substrate under vacuum conditions remain challenging. Further, it has been found that heat extraction from the flexible substrate by using a cooled substrate roller still needs to be improved, particularly with respect to uniformity of heat extraction.

Accordingly, there is a continuous demand for improved substrate transportation rollers, improved roll-to-roll processing apparatuses and methods therefor.

SUMMARY

In light of the above, a roller for transporting a flexible substrate, a vacuum processing apparatus for processing a flexible substrate, and a method of cooling a roller according to the independent claims are provided. Further aspects, advantages, and features are apparent from the dependent claims, the description, and the accompanying drawings.

According to an aspect of the present disclosure, a roller for transporting a flexible substrate is provided. The roller includes a first coolant supply for cooling a first part of the roller. Additionally, the roller includes a second cooling supply for cooling a second part and a third part of the roller. The first part is provided between the second part and the third part.

According to another aspect of the present disclosure, a vacuum processing apparatus for processing a flexible substrate is provided. The vacuum processing apparatus includes a processing chamber including a plurality of processing units having at least one deposition unit. Further, the vacuum processing apparatus includes a roller according to any embodiments described herein for guiding the flexible substrate past the plurality of processing units. In particular, the roller is connected to a coolant supply.

According to a further aspect of the present disclosure, a method of cooling a roller for guiding a flexible substrate is provided. The method includes cooling a first part of the roller by providing a first coolant to the first part. Additionally, the method includes cooling a second part and a third part of the roller by providing a second coolant to the second part and the third part. The first part is provided between the second part and the third part. In particular, the first coolant has a first temperature and the second coolant has a second temperature being different from the first temperature, particularly the first temperature being lower than the second temperature.

According to another aspect of the present disclosure, a method of manufacturing a coated flexible substrate is provided. The method includes using at least one of a roller according to any embodiments described herein, a vacuum processing apparatus according to any embodiments described herein, and a method of cooling a roller according to any embodiments described herein.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
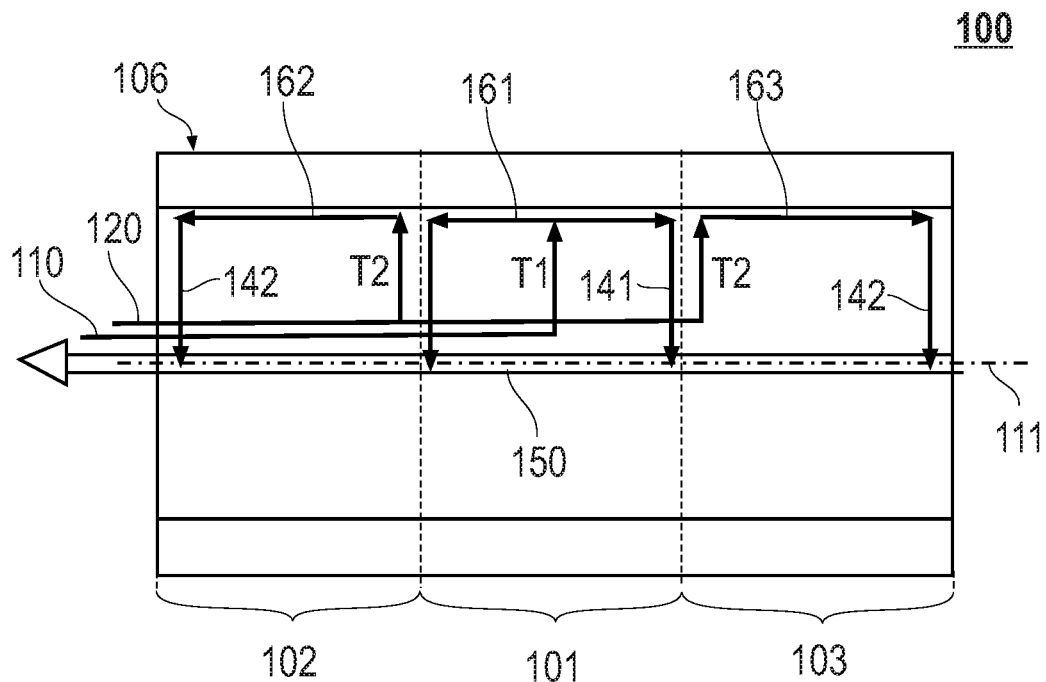
FIG. 1 shows a schematic longitudinal sectional view of a roller according to embodiments described herein.

With exemplary reference to FIG. 1, a roller 100 for transporting a flexible substrate according to the present disclosure is described. According to embodiments, which can be combined with any other embodiments described herein, the roller 100 includes a first coolant supply 110 for cooling a first part 101 of the roller 100. Additionally, the roller 100 includes second coolant supply 120 for cooling a second part 102 and a third part 103 of the roller 100. The first part 101 is provided between the second part 102 and the third part 103. In particular, the first part 101 is an axial middle part of a main body 106 of the roller 100. Typically, the first part 101 is a first cylindrical portion of a cylindrical main body 106 of the roller 100. Accordingly, typically the second part 102 is a second cylindrical portion of the main body 106 and the third part 103 is a third cylindrical portion of the main body 106.

Accordingly, compared to the prior art, beneficially an improved roller for transporting a flexible substrate is provided. In particular, embodiments of the roller described herein provide for selectively and individually cooling different parts of a roller for transporting a flexible substrate. Accordingly, a part of the roller being exposed to higher temperatures, typically the middle part of the roller being exposed to elevated temperatures during material deposition, can be cooled independently from other parts of the roller. Further, embodiments of the roller as described herein beneficially provide for the possibility to extract heat from the flexible substrate in a uniform manner. Accordingly, the risk of wrinkle generation during transportation of the flexible substrate can be reduced or even eliminated. Consequently, the quality of coatings deposited on the flexible substrate can be improved. Further, providing a roller having selectively coolable parts has the advantage that the roller shape can be controlled by using thermal material deformation effects such as thermal expansion and thermal contraction. For instance, the shape of the roller, particularly the substrate support surface, can be changed. In particular, the shape of the roller can be controlled to have a flat substrate support surface, a concave substrate support surface or a convex substrate support surface.

Before various further embodiments of the present disclosure are described in more detail, some aspects with respect to some terms used herein are explained.

In the present disclosure, a "roller" can be understood as a drum or a roller having a substrate support surface for contacting the flexible substrate. The expression "substrate support surface for contacting the flexible substrate" can be understood in that the outer surface of the roller, e.g. the outer surface of the sleeve as described herein, is configured for contacting the flexible substrate during the guiding or transportation of the flexible substrate. Typically, the support surface is a curved outer surface, particularly a cylindrical outer surface, of the roller. Accordingly, typically the roller is rotatable about a rotation axis and includes a substrate guiding region. Typically, the substrate guiding region is a curved substrate support surface, e.g. a cylindrically symmetric surface, of the roller. The curved substrate support surface of the roller may be adapted to be (at least partly) in contact with the flexible substrate during the guiding of the flexible substrate. The substrate guiding region may be defined as an angular range of the roller in which the substrate is in contact with the curved substrate support surface during the guiding of the substrate, and may correspond to the enlacement angle of the roller. For instance, the enlacement angle of the roller may be 1200 or more, particularly 180° or more, or even 270° or more. According to some embodiments, which can be combined with other embodiments described herein, the roller 100 is cylindrical and has a length L of 0.5 m≤L≤8.5 m. Further, the roller 100 may have a diameter D of 0.2 m≤D≤3.0 m, particularly 0.2 m≤D≤2.0 m, for instance D=0.4 m±0.2 m. Accordingly, beneficially the roller is configured for guiding and transporting flexible substrates having a large width.

In the present disclosure, a "flexible substrate" can be understood as a bendable substrate. For instance, the "flexible substrate" can be a "foil" or a "web". In the present disclosure the term "flexible substrate" and the term "substrate" may be synonymously used. For example, the flexible substrate as described herein may be made of or include materials like PET, HC-PET, PE, PI, PU, TaC, OPP, BOOP, CPP, one or more metals (e.g. copper), paper, combinations thereof, and already coated substrates like Hard Coated PET (e.g. HC-PET, HC-TaC) and the like. In some embodiments, the flexible substrate is a COP substrate provided with an index matched (IM) layer on both sides thereof. For example, the substrate thickness can be 1 μm or more and 1 mm or less, particularly 500 μm or less, or even 200 μm or less. The substrate width $W_S$ can be 0.3 m≤W≤8 m. The substrate may be a transparent or non-transparent substrate.

In the present disclosure, a "main body" of the roller can be understood as a cylindrical body, particularly a cylindrical shell body of solid material. Typically, the main body is made of a material having a high thermal conductivity λ, particularly λ≥50 W/(m·K), more particularly λ≥100 W/(m·K). For instance, the main body can be made of a material including copper such as copper alloys. In particular, the main body can be made of copper. It is to be understood that alternatively the main body may be made of any other suitable material having high thermal conductivity λ.

In the present disclosure, a "coolant supply" can be understood as a device or system configured for providing a coolant. Accordingly, a coolant supply as described herein typically includes a coolant and a piping for delivering the coolant. More specifically, the coolant supply may include a closed loop refrigeration system having a heat absorber, a pressure decreaser, a pressure increaser, and a heat rejector. Typically, the heat absorber is provided by a piping provided at the site to be cooled, e.g. the one or more parts of the roller as described herein. In the present disclosure, a "coolant" can be understood as a cooling fluid, particularly an incompressible cooling fluid, enabling to provide cooling temperatures in the range from −100° C. to +80° C., particularly −50° C. to +80° C., more particularly −30° C. to +80° C. Further, typically the coolant is non-toxic and does not react with lithium. For example, the coolant can be oil.

In the present disclosure, a "part of the roller" can be understood as a part of the roller having a substrate support surface. Typically, a "part of the roller" as described herein can be understood as a cylindrical portion of a cylindrical main body as described herein.

With exemplary reference to FIG. 1, according to embodiments which can be combined with any other embodiments described herein, the first coolant supply 110 is configured for providing a first coolant of a first temperature T1. The second coolant supply 120 is configured for providing a second coolant of a second temperature T2 being different from the first temperature T1. In particular, the first temperature T1 is lower than the second temperature T2.

As schematically shown in FIG. 1, according to embodiments which can be combined with any other embodiments described herein, the first coolant supply 110 includes a first heat absorber 161 for removing heat from the first part 101 of the roller 100. Typically, the second coolant supply 120 includes a second heat absorber 162 for removing heat from the second part 102 of the roller 100. Further, as exemplarily shown in FIG. 1, the second coolant supply 120 includes a third heat absorber 163 for removing heat from the third part 103 of the roller 100. For example, a "heat absorber" as described herein can be provided by a piping, particularly being in contact with the part of the roller to be cooled. For instance, the piping of the heat absorber can include windings provided around the central rotation axis 111 of the roller. For simplification of illustration, only the upper part of FIG. 1 shows the coolant supplies, i.e. the first coolant supply 110 and the second coolant supply 120. However, it is to be understood that typically the complete cylindrical parts, e.g. the first part 101, the second part 102 and the third part 103 shown in FIG. 1, can be cooled by the respective coolant supply as described herein. Accordingly, the upper illustration of FIG. 1 may also apply to the lower portion of FIG. 1.

As schematically shown in FIG. 1, according to embodiments which can be combined with any other embodiments described herein, the first coolant supply 110 includes a first coolant piping 141 and the second coolant supply 120 includes a second coolant piping 142 both being connected to a common coolant outflow piping 150. In particular, as exemplarily shown in FIG. 1, the coolant outflow piping extends along a direction of a central rotation axis 111 of the roller.

Figure 2:
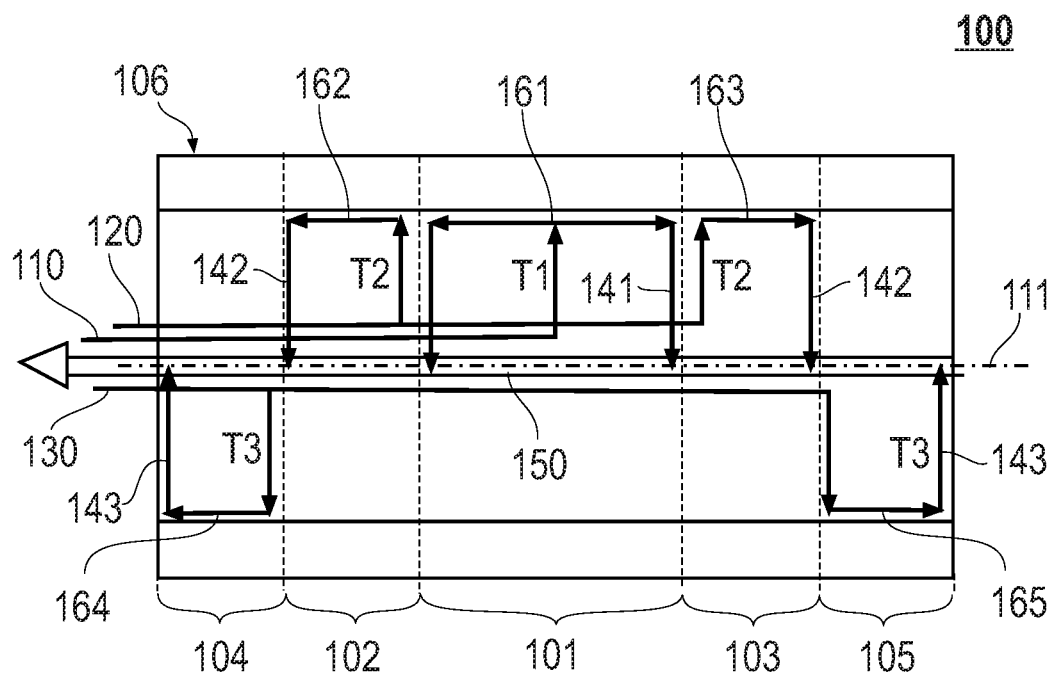
FIG. 2 shows a schematic longitudinal sectional view of a roller according to further embodiments described herein.

With exemplary reference to FIG. 2, according to embodiments which can be combined with any other embodiments described herein, the roller further includes a third coolant supply 130 for cooling a fourth part 104 and a fifth part 105 of the roller 100. Typically, the second part 102 is provided between the first part 101 and the fourth part 104. The third part 103 can be provided between the first part 101 and the fifth part 105. Typically, the fourth part 104 is a fourth cylindrical portion of the cylindrical main body 106 of the roller 100. Accordingly, typically the fifth part 105 is a fifth cylindrical portion of the cylindrical main body 106.

As schematically shown in FIG. 2, according to embodiments which can be combined with any other embodiments described herein, the third coolant supply 130 includes a fourth heat absorber 164 for removing heat from the fourth part 104 of the roller 100. Further, typically the third coolant supply 130 includes a fifth heat absorber 165 for removing heat from the fifth part 105 of the roller 100. Similarly, as in FIG. 1, for simplification of illustration, only the lower portion of FIG. 2 shows the third coolant supply. However, it is to be understood that the illustration of the third coolant supply 130 shown in the lower portion of FIG. 2 typically also applies to the upper portion of FIG. 2.

As exemplarily shown in FIG. 2, according to embodiments which can be combined with any other embodiments described herein, the third coolant supply 130 includes a third coolant piping 143 connected to a coolant outflow piping 150 extending along a direction of a central rotation axis 111 of the roller 100. In particular, as exemplarily shown in FIG. 2, each of the first coolant piping 141, the second coolant piping 142, and the third coolant piping 143 are connected to a common coolant outflow piping.

According to embodiments which can be combined with any other embodiments described herein, the third coolant supply 130 is configured for providing a third coolant of a third temperature T3 being different from the first temperature T1 and the second temperature T2. In particular, the third temperature T3 can be lower than the first temperature T1. Additionally or alternatively, the third temperature T3 can be lower than the second temperature T2.

Figure 3:
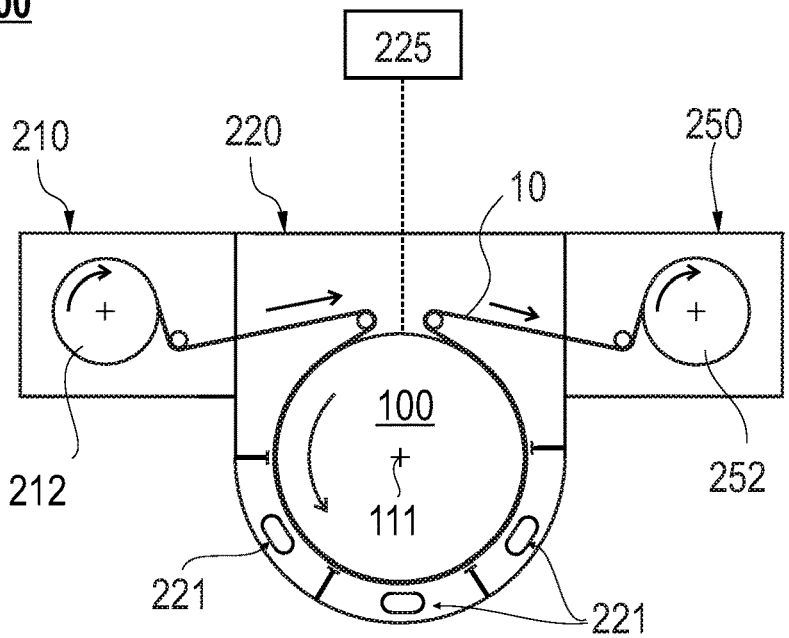
FIG. 3 shows a schematic view of a vacuum processing apparatus according to embodiments described herein.

With exemplary reference to FIG. 3, a vacuum processing apparatus 200 according to the present disclosure is described. According to embodiments, which can be combined with any other embodiments described herein, the vacuum processing apparatus 200 includes a processing chamber 220 including a plurality of processing units 221. The plurality of processing units 221 include at least one deposition unit. Further, the vacuum processing apparatus 200 includes a roller 100 according to any embodiments described herein for guiding the flexible substrate past the plurality of processing units 221.

As schematically shown in FIG. 3, the roller 100 can be connected to a coolant supply 225. Typically, the coolant supply 225 is configured for providing two or more coolants of different temperatures. In particular, the coolant supply 225 is configured for providing a first coolant having a first temperature T1 and a second coolant having a second temperature T2 different from the first temperature T1. Typically, the first temperature T1 is lower than the second temperature T2. Further, it is to be understood that the coolant supply 225 can be configured for providing a third coolant having a third temperature T3, the third temperature T3 being different from the first temperature T1 and the second temperature T2. For example, the third temperature T3 can be lower than the first temperature T1 and/or lower than the second temperature T2.

As exemplarily shown in FIG. 3, typically the vacuum processing apparatus 200 is a roll-to-roll processing system. The roller 100 according to any embodiments described herein can be a processing drum or coating drum of the vacuum processing apparatus. According to embodiments, which can be combined with any other embodiments described herein, the vacuum processing apparatus 200 includes a first spool chamber 210 housing a storage spool 212 for providing the flexible substrate 10. Additionally, the vacuum processing apparatus 200 includes the processing chamber 220 arranged downstream from the first spool chamber 210. Typically, the processing chamber 220 is a vacuum chamber and includes the plurality of processing units 221. The plurality of processing units 221 includes at least one deposition unit. Accordingly, in the present disclosure, a "processing chamber" can be understood as a chamber having at least one deposition unit for depositing material on a substrate. Accordingly, the processing chamber may also be referred to as a deposition chamber. The term "vacuum", as used herein, can be understood in the sense of a technical vacuum having a vacuum pressure of less than, for example, 10 mbar. Typically, the pressure in a vacuum chamber as described herein may be between $10^{-5}$ mbar and about $10^{-8}$ mbar, more typically between $10^{-5}$ mbar and $10^{-7}$ mbar, and even more typically between about $10^{-6}$ mbar and about $10^{-7}$ mbar.

As exemplarily shown in FIG. 3, the plurality of processing units may be arranged in a circumferential direction around the roller 100. As the roller 100 rotates, the flexible substrate 10 is guided past the processing units which face toward the curved substrate support surface of the roller, so that the surface of the flexible substrate can be processed while being moved past the processing units at a predetermined speed. For example, the plurality of processing units may include one or more units selected from the group consisting of: a deposition unit, an etching unit, and a heating unit. A deposition unit of the vacuum processing apparatus as described herein can be a sputter deposition unit, e.g. an AC (alternating current) sputter source or a DC (direct current) sputter source, a RF (radio frequency) sputter source, a MF (middle frequency) sputter source, a pulsed sputter source, a pulsed DC sputter source, a magnetron sputter source, a reactive sputter source, a CVD deposition unit, a PECVD deposition unit, a PVD deposition unit or another suitable deposition unit. It is to be understood that typically a deposition unit as described herein is adapted for depositing a thin film on a flexible substrate, e.g., to form a flexible display device, a touch-screen device component, or other electronic or optical devices. A deposition unit as described herein can be configured for depositing at least one material selected from the group of conductive materials, semi-conductive materials, dielectric materials, or isolating materials.

Additionally, as exemplarily shown in FIG. 3, the vacuum processing apparatus 200 may include a second spool chamber 250 arranged downstream from the processing chamber 220. The second spool chamber 250 houses a wind-up spool 252 for winding the flexible substrate 10 thereon after processing.

Figure 4A:
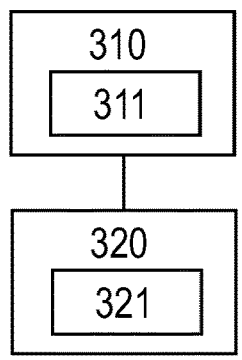
FIGS. 4A and 4B show block diagrams for illustrating embodiments of a method of cooling a roller for guiding a flexible substrate according to the present disclosure.

With exemplary reference to the block diagram shown in FIG. 4A, a method 300 of cooling a roller for guiding a flexible substrate according to the present disclosure is described. According to embodiments, which can be combined with any other embodiments described herein, the method 300 includes cooling (represented by block 310 in FIG. 4A) a first part 101 of the roller (100) by providing (represented by block 311 in FIG. 4A) a first coolant to the first part 101. Additionally, the method 300 includes cooling (represented by block 320 in FIG. 4A) a second part 102 and a third part 103 of the roller 100 by providing (represented by block 321 in FIG. 4A) a second coolant to the second part 102 and the third part 103. As described herein, the first part 101 is provided between the second part 102 and the third part 103. In particular, the first coolant has a first temperature T1 and the second coolant has a second temperature T2 being different from the first temperature T1. In particular, the first temperature T1 is lower than the second temperature T2.

Figure 4B:
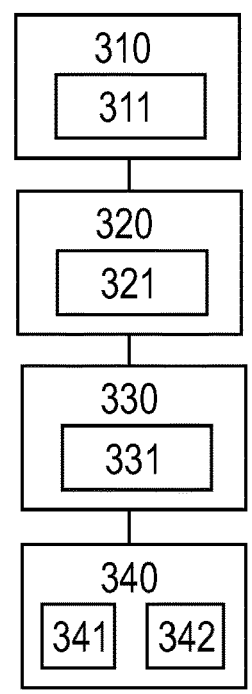

With exemplary reference to FIG. 4B, according to embodiments which can be combined with any other embodiments described herein, the method 300 includes cooling (represented by block 330 in FIG. 4B) a fourth part 104 and a fifth part 105 of the roller 100 by providing (represented by 331 in FIG. 4B) a third coolant to the fourth part 104 and the fifth part 105. As described herein, typically the second part 102 is provided between the first part 101 and the fourth part 104. The third part 103 is typically provided between the first part 101 and the fifth part 105. More specifically, typically the third coolant has a third temperature T3 being different from the first temperature T1 and the second temperature T2. In particular, the third temperature T3 can be lower than the first temperature T1 and/or lower than the second temperature T2.

According to embodiments, which can be combined with any other embodiments described herein, the method 300 further includes changing (represented by block 340 in FIG. 4B) a shape of the roller 100 by thermally expanding (represented by block 341 in FIG. 4B) or thermally contracting (represented by block 342 in FIG. 4B) at least one part of the roller 100. In particular, changing the shape of the roller can include providing a convex roller shape or providing a concave roller shape. For example, by cooling an axial middle portion of the roller (e.g. the first part 101 as described herein) to a lower temperature than the lateral side portions of the roller (e.g. the second part 102 and the third part 103 as described herein), a concave roller shape can be obtained. Providing a concave roller shape can be beneficial, since a stretching of the flexible substrate can be achieved which may be beneficial for avoiding wrinkles.

According to embodiments, which can be combined with any other embodiments described herein, the method 300 includes using a roller 100 according to any embodiments described herein.

Although not explicitly described herein, it is to be understood that more than three separately controllable coolant supplies may be provided. For instance, by providing a fourth and a fifth coolant supply similarly configured as the second and third coolant supply, ten separate parts of the roller could be cooled.

In view of the embodiments described herein, it is to be understood that, according to an aspect of the present disclosure, a method of manufacturing a coated flexible substrate can be provided. The method includes using at least one of a roller 100 according to any embodiments described herein, a vacuum processing apparatus 200 according to any embodiments described herein, and a method 300 of cooling a roller according to any embodiments described herein.

In view of the above, it is to be understood that compared to the state of the art, embodiments as described herein provide for improved flexible substrate transportation, improved roller cooling, improved substrate cooling, such that beneficially thinner and wider flexible substrates can be processed with improved processing results.

While the foregoing is directed to embodiments, other and further embodiments may be devised without departing from the basic scope, and the scope is determined by the claims that follow.

The invention claimed is:

1. A method of cooling and guiding a flexible substrate by a roller, comprising:
    guiding a flexible substrate from a storage spool to a roller;
    moving the flexible substrate past a processing unit while the flexible substrate is guided by the roller;
    cooling a first part of the roller by providing a first coolant to the first part;
    cooling a second part and a third part of the roller by providing a second coolant to the second part and the third part, the first part being provided between the second part and the third part, the first coolant having a first temperature (T1) and the second coolant having a second temperature (T2) being different from the first temperature (T1); and
    changing a shape of the roller by thermally expanding or thermally contracting at least one part of the roller, wherein changing the shape of the roller comprises changing the shape of the roller to be convex or concave.

2. The method of claim 1, wherein the first temperature is lower than the second temperature (T2).

3. The method of claim 1, wherein the first part is an axial middle part of a main body of the roller.

4. The method of claim 1, wherein providing the first coolant to the first part of the roller is conducted by using a first coolant supply, and wherein cooling the second part and the third part of the roller is conducted by using a second coolant supply.

5. The method of claim 4, wherein the first coolant supply comprises a first coolant piping and the second coolant supply comprises a second coolant piping both being connected to a common coolant outflow piping.

6. The method of claim 5, wherein the common coolant outflow piping extends along a direction of a central rotation axis of the roller.

7. The method of claim 1, wherein the first part, the second part, and the third part of the roller provide a substrate support surface.

8. The method of claim 1, wherein changing the shape of the roller is conducted by cooling an axial middle portion of the roller to a lower temperature than lateral side portions of the roller.

9. The method of claim 1, further comprising cooling a fourth part and a fifth part of the roller by providing a third coolant to the fourth part and the fifth part, the second part being provided between the first part and the fourth part, the third part being provided between the first part and the fifth part, the third coolant having a third temperature (T3).

10. The method of claim 9, wherein the third temperature (T3) is different from the first temperature (T1) and the second temperature (T2).

11. The method of claim 9, wherein the third temperature (T3) is lower than the first temperature (T1) and lower than the second temperature (T2).

12. The method of claim 9, wherein providing the first coolant to the first part of the roller is conducted by using a first coolant supply, wherein cooling the second part and the third part of the roller is conducted by using a second coolant supply, and wherein providing the third coolant to the fourth part and the fifth part of the roller is conducted by using a third coolant supply.

13. The method of claim 12, wherein the first coolant supply comprises a first coolant piping, the second coolant supply comprises a second coolant piping, and the third coolant supply comprises a third coolant piping, wherein the first coolant, second coolant piping, and the third coolant piping are connected to a common coolant outflow piping extending along a direction of a central rotation axis of the roller.

14. The method of claim 9, wherein the first part, the second part, the third part, the fourth part, and the fifth part of the roller provide a substrate support surface.

15. A method of cooling and guiding a flexible substrate by a roller, comprising:
   guiding a flexible substrate from a storage spool to a roller;
   moving the flexible substrate past a processing unit while the flexible substrate is guided by the roller;
   cooling a first part of the roller by providing a first coolant to the first part from a first coolant supply;
   cooling a second part and a third part of the roller by providing a second coolant from a second coolant supply to the second part and the third part, the first part being provided between the second part and the third part, the first coolant having a first temperature (T1) and the second coolant having a second temperature (T2) being different from the first temperature (T1); and
   changing a shape of the roller by thermally expanding or thermally contracting at least one part of the roller, to change the shape of the roller to be convex or concave
   wherein,
      the first coolant supply comprises a first coolant piping and the second coolant supply comprises a second coolant piping both being connected to a common coolant outflow piping, and
      the common coolant outflow piping extends along a direction of a central rotation axis of the roller.

16. The method of claim 15, wherein the first coolant piping and the second coolant piping are connected to the common coolant outflow piping within the roller.

* * * * *